United States Patent
Shachar et al.

(10) Patent No.: US 7,436,920 B2
(45) Date of Patent: Oct. 14, 2008

(54) BURST MODE RECEIVER BASED ON CHARGE PUMP PLL WITH IDLE-TIME LOOP STABILIZER

(75) Inventors: Shlomo Shachar, San Francisco, CA (US); Oren Moshe, San Francisco, CA (US)

(73) Assignee: Matisse Networks, Mountain View, CA (US)

( * ) Notice: Subject to any disclaimer, the term of this patent is extended or adjusted under 35 U.S.C. 154(b) by 149 days.

(21) Appl. No.: 10/868,894

(22) Filed: Jun. 17, 2004

(65) Prior Publication Data

US 2005/0281366 A1 Dec. 22, 2005

(51) Int. Cl.
*H03D 3/24* (2006.01)

(52) U.S. Cl. .................. 375/376; 375/374; 327/148; 455/260

(58) Field of Classification Search ............... 375/376, 375/373, 375, 372, 355, 371, 374; 327/156, 327/147, 159, 158, 148; 398/202; 331/2, 331/46, 11, 1 A, 12, 17, 25, 34; 455/260
See application file for complete search history.

(56) References Cited

U.S. PATENT DOCUMENTS

| | | | | |
|---|---|---|---|---|
| 3,610,954 A | * | 10/1971 | Treadway | 327/12 |
| 5,015,970 A | * | 5/1991 | Williams et al. | 331/11 |
| 5,539,346 A | * | 7/1996 | Goto | 327/156 |
| 6,043,715 A | * | 3/2000 | Bailey et al. | 331/2 |
| 6,211,741 B1 | * | 4/2001 | Dalmia | 331/11 |
| 6,363,129 B1 | * | 3/2002 | Agazzi | 375/355 |
| 6,392,495 B1 | | 5/2002 | Larsson | |
| 6,606,365 B1 | * | 8/2003 | Chen | 375/376 |
| 6,608,511 B1 | * | 8/2003 | Hsu | 327/157 |
| 6,633,751 B1 | * | 10/2003 | Damgaard et al. | 455/126 |
| 6,683,930 B1 | * | 1/2004 | Dalmia | 375/376 |
| 2003/0067662 A1 | * | 4/2003 | Brewer et al. | 359/189 |
| 2004/0013217 A1 | * | 1/2004 | Dietrich et al. | 375/372 |
| 2005/0001661 A1 | * | 1/2005 | Regev | 327/156 |

OTHER PUBLICATIONS

Supplementary European Search Report dated Jun. 20, 2007.

* cited by examiner

*Primary Examiner*—Temesghen Ghebretinsae
(74) *Attorney, Agent, or Firm*—Squire, Sanders & Dempsey L.L.P.

(57) ABSTRACT

An improved burst mode receiver includes a digital phase detector, receiving an incoming signal. The receiver also includes a charge pump, receiving pulse signals from the digital phase detector to compare the incoming clock phase to the local generated clock phase and to control the charge pump, a loop filter, receiving a charge value from the charge pump and producing a control signal and a local clock generator, receiving the control signal, producing a recovered clock and supplying the recovered clock to the digital phase detector.

13 Claims, 3 Drawing Sheets

BURST MODE RECEIVER BASED ON CHARGE PUMP PLL WITH IDLE-TIME LOOP STABILIZER

BACKGROUND OF THE INVENTION

1. Field of the Invention

The present invention relates to processing of signals in network environments. The present invention relates to an implementation of burst mode receiver that receives packets in a bursty mode with possible idle periods between sequential receptions. The functionality of burst mode receiver related in this invention is to lock on the incoming signal, and recover the clock and the data from the signal. In particular, the present invention relates to the use of such burst mode receiver in high-speed (such as 10 Gbps or 40 Gbps) optical systems, cross-bar switches and all-optical networks.

2. Description of Related Art

Fiber-optic infrastructure is a vital part of today's rapidly changing worldwide networks. The drive for interconnectivity as well as the exponential growth in data traffic, as a result of new applications, requires the adoption of new solutions and in particular optical routing solutions that embody routers that handle optical packets. These new generation optical routers must be able to handle terabytes of data that arrive from different sources in a burst-mode, and multi-layer routing structure based on DWDM optical. In order to handle burst-mode traffic, the optical router should be capable of transmitting bursty packets to the destination routers and receive bursty packets from the source routers.

A vital component in an optical router is a burst-mode receiver (BMR). That component receives fixed-size or variable-size packets at high-speed, in burst-mode with possible unknown idle periods between sequential receptions, and recovers the clock and the data from the signal. Generally, a clock and data recovery receiver, (CDR), that is not locked on an incoming signal requires a period of active signal before it is capable of extracting a correct clock and data from the incoming signal. This period is called the receiver "locking time" or "acquisition time".

In continuous systems, the transmitter sends packets continuously to the receiver, and thus the receiver requires a single locking time to lock on the incoming signal when it first appears; after that it stays locked, assuming that the signal arrives without interference. In case that the transmitter does not have packets to transmit, it still sends dummy sequence to keep the receiver locked.

In a burst mode system, the transmitter sends the signal in bursts, and thus on the start of each burst of data, the receiver requires a locking time to lock onto the signal. Since during the locking time the receiver cannot extract a valid clock and data, the transmitter starts each burst with a preamble sequence for a locking time. Thereafter, the data itself is sent. Usually a preamble sequence is "101010 . . ." since this is the easiest pattern to lock on.

In the burst mode system, the preamble sequence that lasts for the duration of the locking time is a wasted transmission time since it does not carry a valid data. Thus, in order to achieve high performance system, the locking time is minimized as much as possible. Burst mode receivers are receivers which have locking times that are much shorter when compared to continuous mode receivers.

Burst mode receivers can be classified to two groups: over sampling clock recovery, and non-over sampling clock recovery. Over sampling clock recovery receivers are based on the concept of sampling each bit the incoming signal several times with a higher speed sampler and detecting the transitions in the samples. The advantage of such receivers is that their locking time can be very short. However, since such receivers require over sampling of at least four samples per-bit, this kind of receivers is limited to low speed systems (below 1 Gbps). The use of such receivers is popular in the PON (passive optical networks) standard which operates at 622 Mbps. In high-speed systems, such as 10 Gbps or 40 Gbps systems, these kind of receivers cannot be used since it requires 40 G or 160 Gbps sampling rate which is very hard to implement and may not possible with today's technology. In addition, this method requires that the receiver and the transmitter clocks will be close enough to achieve a proper lock.

For such faster networks, non over sampling clock recovery receivers, which are capable of reaching 10 Gbps and even 40 Gbps line rate, are of greater interest. Thus, there is a need in the prior art for a burst mode receiver that has a reduced locking time without increasing noise in the recovered clock and less prone to loss of lock after the lock has been obtained.

SUMMARY OF THE INVENTION

According to one embodiment of the present invention, a burst mode receiver is disclosed. The receiver includes a digital phase detector, receiving an incoming signal and the local recovered clock, a charge pump, receiving pulse signals from the digital phase detector to control the charge pump, a loop filter, receiving a charge value from the charge pump and producing a control signal and a clock generator, receiving the control signal, producing a recovered clock and supplying the recovered clock to the digital phase detector.

Additionally, the clock generator may be a voltage controlled oscillator or a direct digital synthesizer. The loop filter may be a resistor and a capacitor in series and the charge pump may be configured to provide the charge value to the loop filter such that electrical change is injected or removed from the capacitor of the loop filter. The burst mode receiver may include a clock generator that outputs a recovered clock signal and the digital phase detector may receive the recovered clock signal. Also, the digital phase detector may be configured to compare the incoming signal with a local generated clock, where the digital phase detector may be configured to output the charge value based on whether the local generated clock lags or leads the incoming signal.

Also, the burst mode receiver may also include a reference clock source, producing a local generated clock signal, a second digital phase detector, receiving the local generated clock signal and generating second pulse signals and a second charge pump, receiving the second pulse signals and providing a second charge value to the loop filter. The receiver may also include a shut off switch, in series with the reference clock source, the second digital phase detector and the second charge pump and configured to prevent the second charge value from being provided to the loop filter. The burst mode receiver may also include a frequency divider, receiving the recovered clock and providing a divided frequency recovered clock signal to the second digital phase detector.

According to an additional; embodiment, a method of recovering a clock signal in a burst mode receiver is also disclosed. The method includes receiving an incoming signal by a digital phase detector, comparing the incoming signal phase to the local recovered clock phase, receiving pulse signals from the digital phase detector by a charge pump, to control the charge pump, receiving a charge value by a loop filter from the charge pump, producing a control signal by the loop filter and controlling local clock generator to producing a recovered clock.

According to an additional embodiment, a burst mode receiver is disclosed. The receiver includes receiving means for receiving an incoming signal, generating means for generating pulse signals based on the incoming signal, charge pumping means for pumping charge based on the pulse signals, loop filtering means for producing a filtered control signal, receiving charge from the charge pumping means and controlling means for controlling the generating means based on the control signal and producing a recovered clock.

BRIEF DESCRIPTION OF THE DRAWINGS

For the present invention to be easily understood and readily practiced, preferred embodiments will now be described, for purposes of illustration and not limitation, in conjunction with the following figures.

DETAILED DESCRIPTION OF PREFERRED EMBODIMENTS

The present invention is directed to implementations of a burst mode receiver that is based on charge-pump PLL approach. Additionally, embodiments of the invention are directed to an idle-period loop stabilizer that avoids the loop capacitor discharge problem and allows fast locking even after a long period of idle. The idle-period loop stabilizer includes an additional digital phase detector, charge pump and current attenuator/amplifier module.

Figure 1:
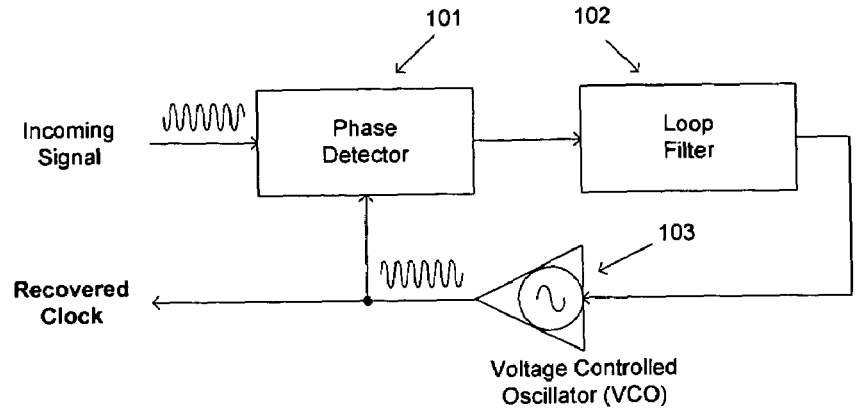
FIG. 1 illustrates a typical phase lock loop circuit, according to prior art designs.

A conventional phase lock loop (PLL) based receiver, which is illustrated in FIG. 1, has a voltage control oscillator 103 (VCO) or a direct digital synthesizer (DDS) to generate a local clock signal, a phase detector 101, and a loop filter 102. The phase detector 101 compares the local clock signal phase to the incoming signal phase, and generates a phase error signal. This signal is smoothed by a loop filter 102. The output of the loop filter 102 is used to tune the local clock oscillator 103 (VCO or DDS) in the direction that will decrease the phase error. When the phase error is small enough, the receiver is locked and the recovered clock can used to sample the incoming signal (one sample per bit) and extract the data.

A receiver using a Delay lock loop (DLL) is similar to the PLL except that it uses a fixed local clock oscillator at the exact received clock and the phase error signal is used to tune the local clock oscillator's phase.

In both the DLL and PLL receivers, the reduction of the locking time is limited by the ability of the loop to tune the local clock oscillator fast enough and to bring it close to the incoming signal clock; this parameter is controlled by the loop filter. A wider loop filter means a shorter delay of the loop filter, which provides a faster response. However, a drawback of widening the loop filter is that more noise is introduced to the loop, jitter may be added to the local clock and there is a significantly increased probability that the receiver may lose the lock after the locking is achieved.

Figure 2:
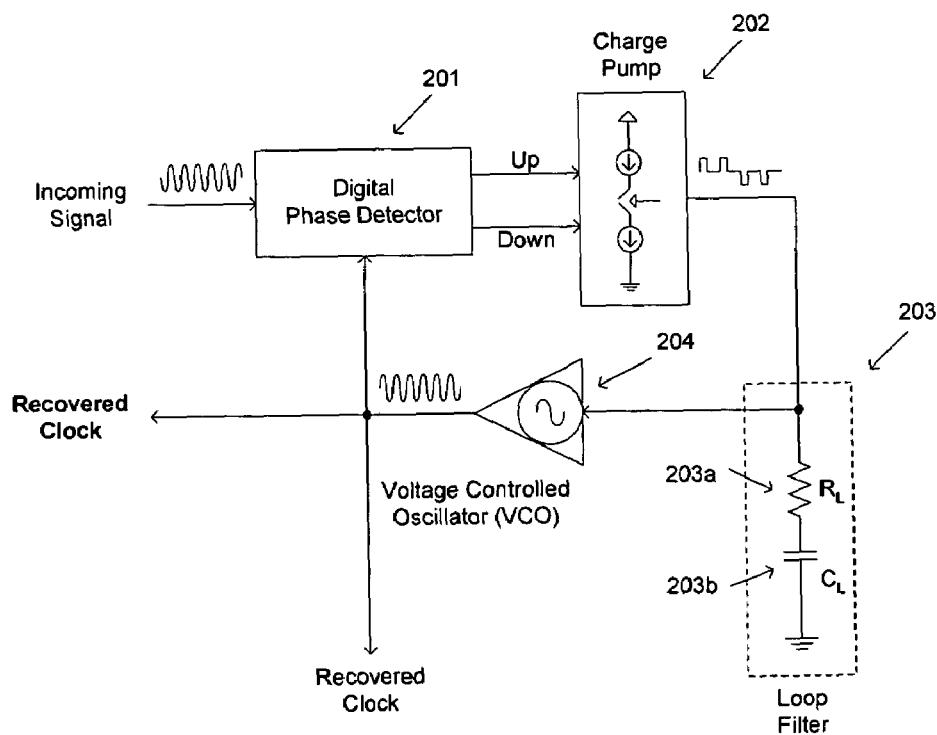
FIG. 2 illustrates a typical charge-pump based phase lock loop circuit, according to one embodiment of the present invention.

To make improvements, the present invention is directed to PLL-based receivers having charge-pump-based PLL, according to one embodiment, which is illustrated in FIG. 2. Charge-pump PLL has a digital phase-detector 201 that can be implemented from digital logic blocks, current charge-pump 202, low-pass filter 203 that produce the control voltage to the voltage controlled oscillator, and a voltage controlled oscillator 204. The digital phase detector 201 can compare the incoming signal phase with the local generated clock (the output of the VCO) and produces series of pulses that represent whether the internal clock lags or leads the incoming signal. These pulses drive a charge pump 202 that slowly injects or removes charge from the low pass filter's capacitor 203*b*. This capacitor 203*b* holds the VCO control voltage which sets the VCO's operating frequency. The fact that this charge-pump based PLL can operate at the highest speed at which a process can make a working flip-flop is an improvement of the present invention over the prior art methods. Additionally, the easy implementation of this embodiment makes this kind of PLL very useful in high speed clock-data recovery devices.

Another advantage of the charge-pump PLL is that it is able to quickly lock on the incoming signal phase, although the process of locking on the frequency takes a longer period of time. This characteristic makes the charge-pump PLL a more suitable approach to implement a burst mode receiver than other approaches. However, the main obstacle in using the charge-pump PLL for a burst mode receiver is that when the loop is not fed with a signal (during idle time), the loop capacitor tends to discharge. In this case, when a signal arrives after a long idle, the loop capacitor needs to be recharged before the PLL achieves valid lock.

Figure 3:
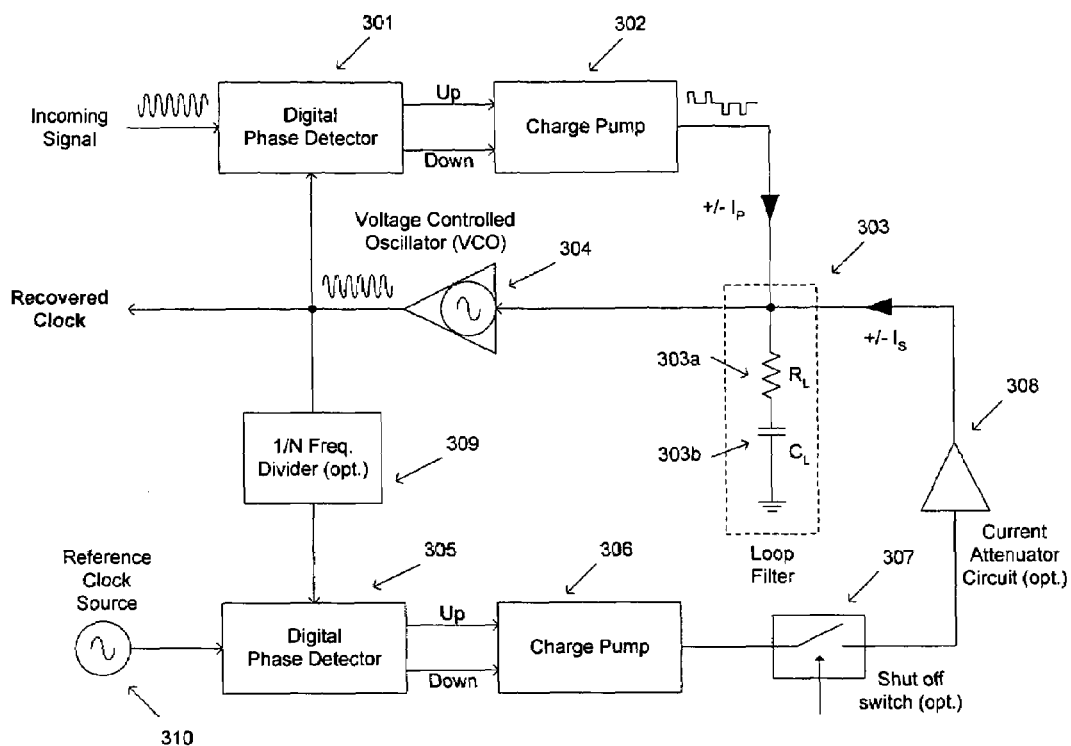
FIG. 3 illustrates a charge-pump based phase lock loop with an idle-period stabilizer for burst-mode application, according to one embodiment of the present invention.

In order to solve the loop stability issue during the idle-periods, an additional embodiment of the present invention, illustrated in FIG. 3, is disclosed. This configuration uses two loops: a strong loop, that pulls the local signal to the incoming signal, and a weak loop, that pulls the local signal to a local reference clock. The strong loop is responsible for locking the local clock source to the incoming signal when an input signal is available. When input signal is not available, the charge-pump 302 does not produce current pulses and the weak loop is responsible for locking the local clock source to the local reference clock.

The strong loop, in certain embodiments, has a digital phase detector 301 that compares the incoming signal phase with the voltage controlled oscillator 304 outputs. According to whether the local signal phase lags or leads, the incoming signal phase the digital phase detector generates up or down commands to the charge pump 302. The charge pump 302 generates, according to the up and down commands, positive or negative current pulses that charge or discharge the capacitor 303*b* at the loop filter 303. This changes the input voltage to the VCO 304 which changes the VCO output frequency and phase.

The weak loop has a optional frequency divider 309 that divides the VCO 304 output to a lower frequency, a local clock source 310 that has a frequency that is close but not necessary the same as the frequency output of the frequency divider 309. The phase detector 305 compares the two signals and generates up and down commands to the charge pump 306. The output current pulses from the charge pump 306 passes through an optional shut off switch 307. The shut off switch allows for the weak loop to be "turned off" according to an external control or to an incoming signal power detect control. The charge-pump output current is optionally attenuated or amplified by the current attenuator circuit 308 to match to the desire level before it introduced to the loop filter 303.

If the shut off switch 307 is not used in the circuit, the loop filter 303 accepts current Ip from the strong loop and current Is from the weak loop. In order to avoid an interference of the weak loop with the strong loop, it is preferred that the weak loop current Is be small when compared to the strong loop current Ip. Based on computer simulations and lab tests, Ip should be ten times stronger than Is (Is~Ip/10) to achieve the desired operation. On the other hand, it is important that Is be able to compensate for a leakage current that discharges the capacitor. If the current from the weak loop much smaller than the leakage current, the capacitor 303b will be discharge and the effect of keeping the loop in the area of the right frequency will be lost.

Figure 4:
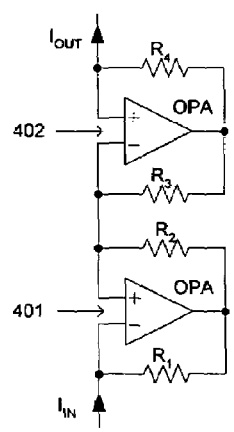
FIG. 4 illustrates a proposed current attenuator/amplifier that can be used in conjunction with the burst mode circuit that illustrated in FIG. 3, according to one embodiment of the present invention.

FIG. 4 illustrates a circuit that can be used as a current attenuator or amplifier, as illustrated, element 308, in FIG. 3. The circuit includes two wide-band operational amplifiers, 401 and 402, that are cascaded one to another implementing the desire function, having resistors $R_1$-$R_4$.

Figure 5:
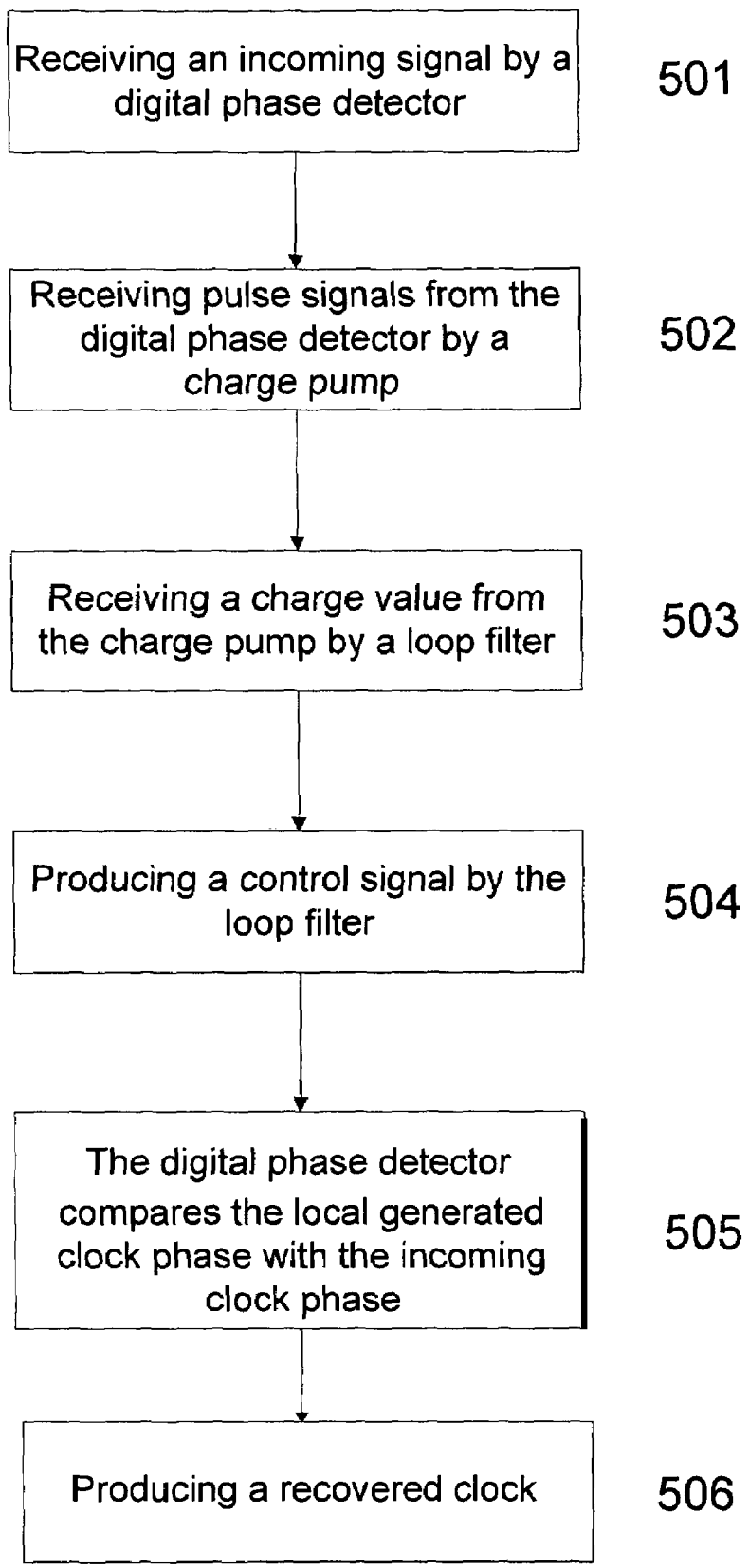
FIG. 5 illustrates a method of achieving a lock in a burst mode receiver, according to one embodiment of the present invention.

A process of recovering a clock signal in a burst mode receiver, according to one embodiment of the present invention, is illustrated in FIG. 5. In step 501, the incoming signal is received by a digital phase detector and, in step 502, pulse signals are generated by the digital phase detector and received by the charge pump. Based on the pulse signals, in step 503, the charge pump provides a charge value to the loop filter. In step 504, the loop filter provides a control signal to the local clock generator, and in step 505 the digital phase detector compares the local generated clock phase with the incoming clock phase. Though this loop, in step 506, the recovered clock is produced to allow for the receiver to properly process the received signal.

Although the invention has been described based upon these preferred embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims.

The invention claimed is:

1. A burst mode receiver comprising:
a phase detector, receiving an incoming signal;
a charge pump, receiving pulse signals from the phase detector to control the charge pump;
a loop filter, receiving a charge value from the charge pump and producing a control signal;
a local clock generator, receiving the control signal, producing a recovered clock and supplying the recovered clock to the phase detector;
a reference clock source, producing a reference clock signal;
a second phase detector, receiving the reference clock signal and generating second pulse signals; and
a second charge pump, receiving the second pulse signals and adding a second charge value to the loop filter, wherein the second charge value is weak relative to the charge value, wherein the receiver includes only two phase detectors, namely the phase detector and the second phase detector.

2. A burst mode receiver as recited in claim 1, further comprising a shut off switch, in series with the reference clock source, the second phase detector and the second charge pump and configured to prevent the second charge value from being provided to the loop filter.

3. A burst mode receiver as recited in claim 1, further comprising a frequency divider, receiving the recovered clock and providing a divided frequency recovered clock signal to the second phase detector.

4. A method of recovering a clock signal in a burst mode receiver, wherein the receiver includes only two phase detectors, the method comprising:
receiving an incoming signal by a phase detector of the two phase detectors;
receiving pulse signals from the phase detector by a charge pump, to control the charge pump;
receiving a charge value by a loop filter from the charge pump;
producing a control signal by the loop filter;
controlling the phase detector through the control signal to produce a recovered clock;
producing a reference clock signal by a reference clock source;
receiving the reference clock signal by a second phase detector of the two phase detectors;
generating second pulse signals by the second phase detector;
receiving the second pulse signals by a second charge pump; and
adding a second charge value to the loop filter based on the second pulse signals, wherein the second charge value is weak relative to the charge value.

5. A burst mode receiver, comprising:
receiving means for receiving an incoming signal;
generating means for generating pulse signals based on the incoming signal, wherein the generating means comprises a first phase detector;
charge pumping means for pumping charge based on the pulse signals;
loop filtering means for producing a filtered control signal, receiving charge from the charge pumping means;
controlling means for controlling the generating means based on the control signal and producing a recovered clock;
producing means for producing a reference clock signal;
second generating means for generating second pulse signals based on the reference clock signal, wherein the second generating means comprises a second phase detector; and
second charge pumping means for additionally pumping a second charge value to the loop filtering means based on the second pulse signals, wherein the second charge value is weak relative to the charge,
wherein the receiver includes only two phase detectors, namely the phase detector and the second phase detector.

6. A burst mode receiver as recited in claim 5, further comprising shut off means for shutting off the second charge value, such that the second charge value is prevented from being provided to the loop filter switch, wherein the shut off means is in series with the producing means, the second generating means and the second charge pumping means.

7. A burst mode receiver as recited in claim 5, further comprising a frequency dividing means for dividing a frequency of a received signal, wherein the frequency dividing means is configured to receive the recovered clock and provide a divided frequency recovered clock signal to the producing means.

8. A burst mode receiver, comprising:
a strong loop configured to pull a local clock source to an incoming signal; and
a weak loop configured to pull the local clock source to a local reference clock signal, wherein the strong loop is configured to lock the local clock source to the incoming signal when the incoming signal is available, wherein the weak loop is configured to lock the local clock source to the local reference clock when the incoming signal is not available, wherein the weak loop is configured to produce a first signal that is configured to be added to a second signal produced by the strong loop, and wherein each of the weak loop and the strong loop comprises only one phase detector.

9. The burst mode receiver of claim 8, wherein the strong loop comprises a voltage controlled oscillator, and a phase detector configured to compare a phase of the incoming signal with an output of a voltage controlled oscillator.

10. The burst mode receiver of claim 8, wherein the weak loop comprises a frequency divider configured to divide an output of a voltage controlled oscillator to a lower frequency, and the local clock source, wherein the local clock source has a frequency close to an output frequency of the frequency divider.

11. The burst mode receiver of claim 8, wherein the weak loop comprises a shut-off switch.

12. The burst mode receiver of claim 8, wherein the strong loop is configured to produce a current that is significantly greater than a current of the weak loop.

13. The burst mode receiver of claim 8, wherein the weak loop is configured to produce a current that is greater than leakage current in the receiver.

* * * * *